United States Patent
Raravikar et al.

(10) Patent No.: US 9,941,652 B2
(45) Date of Patent: Apr. 10, 2018

(54) SPACE TRANSFORMER WITH PERFORATED METALLIC PLATE FOR ELECTRICAL DIE TEST

(71) Applicant: INTEL CORPORATION, Santa Clara, CA (US)

(72) Inventors: Nachiket R. Raravikar, Gilbert, AZ (US); James C. Matayabas, Jr., Gilbert, AZ (US); Akshay Mathkar, Tempe, AZ (US); Dingying Xu, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 90 days.

(21) Appl. No.: 14/973,543

(22) Filed: Dec. 17, 2015

(65) Prior Publication Data

US 2017/0176518 A1 Jun. 22, 2017

(51) Int. Cl.
*G01R 31/28* (2006.01)
*H01R 43/20* (2006.01)
*G01R 1/073* (2006.01)

(52) U.S. Cl.
CPC ......... *H01R 43/20* (2013.01); *G01R 1/07378* (2013.01)

(58) Field of Classification Search
CPC ............ G01R 1/07307; G01R 1/07342; G01R 1/06711; G01R 1/07378; G01R 1/20; G01R 3/00; G01R 31/2834; G01R 31/2889; G01R 1/06727; G01R 1/06733; G01R 31/2808
USPC ............... 324/754.18, 754.01, 754.03, 754.2
See application file for complete search history.

(56) References Cited

U.S. PATENT DOCUMENTS

| | | | |
|---|---|---|---|
| 2003/0010976 A1* | 1/2003 | Grube | G01R 1/07314 257/48 |
| 2005/0077913 A1* | 4/2005 | Watkins | G01R 1/06711 324/756.03 |
| 2007/0139061 A1* | 6/2007 | Eldridge | G01R 1/18 324/750.27 |
| 2009/0151157 A1* | 6/2009 | Kazama | G01R 1/0416 29/829 |
| 2012/0319711 A1* | 12/2012 | Hung | G01R 1/07371 324/750.16 |
| 2013/0135001 A1* | 5/2013 | Breinlinger | G01R 1/067 324/754.03 |
| 2013/0271175 A1* | 10/2013 | Powell | G01R 1/07342 324/756.03 |

* cited by examiner

*Primary Examiner* — Tung X Nguyen
*Assistant Examiner* — Robert P Alejnikov, Jr.
(74) *Attorney, Agent, or Firm* — Green, Howard & Mughal LLP.

(57) ABSTRACT

Space transformer including a substrate and a perforated plate disposed on the substrate. The substrate includes conductive traces and an array of conductive probe pins extend outwardly from anchor points on the substrate. The pins are electrically coupled to at least one of the conductive traces on the substrate as an interface between an E-testing apparatus and a DUT. The perforated plate may be affixed to a surface of the substrate and includes an array of perforations through which the conductive pins may pass. The perforated plate may provide one or more of lateral pin support and protection to the underlying substrate and/or traces. The perforated plate may include a metal sheet. A polymeric material may be disposed on at least a sidewall of the perforations to electrically isolate the metal sheet from the conductive probe pins.

15 Claims, 9 Drawing Sheets

SPACE TRANSFORMER WITH PERFORATED METALLIC PLATE FOR ELECTRICAL DIE TEST

BACKGROUND

In the integrated circuit (IC) industry, devices fabricated in parallel on a large substrate, such as a 300 mm or 450 mm wafer, are typically sorted based on an electrical test (E-test) at the back end of line (BEOL). The devices are singulated into chips following a backside wafer grind. Singulated die identified good at the BEOL E-test are then assembled into a package. A final functional test of the packaged die is then performed. As post-singulation die processing and package assembly practices become more complex, it becomes more important to perform one or more E-test on unpackaged die, for example to filter out die that passed BEOL E-test but have since become unsuitable for packaging.

E-testing of unpackaged die is a significant challenge because of the small dimensions, and vast number of testable points (e.g. top-level metallization) on modern ICs. For example, a microprocessor die may have thousands of testable points. E-testing of a packaged die is comparatively easy as the package assembly breaks out the top-level die metallization (e.g., having a pitch of 100 µm, or less) to packaged electrical connections of much larger dimensions. To perform a comprehensive E-test on an unpackaged die, a prober of an electrical testing apparatus (E-tester) may be coupled to a die through a space transforming prober interface.

During testing, the space transformer must withstand repetitive interfacing with consecutive unpackaged die under test (DUT). Top-level interconnect geometries (e.g., having a pitch of 100 µm, or less) must be accommodated as they are scaled, so electrical probe pin dimensions and alignment are critical to ensure accurate testing without damage to the DUT. Furthermore, many testing algorithms place the DUT under thermal stress, for example testing at temperatures of 200° C., or more. Therefore the space transformer must also be robust to such thermal cycling.

Space transformer architecture is therefore important for high E-tester up-time.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that the present embodiments may be practiced without these specific details. In some instances, well-known methods and devices are shown in block diagram form, rather than in detail, to avoid obscuring features of the exemplary embodiments. Reference throughout this specification to "an embodiment" or "one embodiment" means that a particular feature, structure, function, or characteristic described in connection with the embodiment is included in at least one embodiment. Thus, the appearances of the phrase "in an embodiment" or "in one embodiment" in various places throughout this specification are not necessarily referring to the same embodiment. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description of the exemplary embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example in the context of materials, one material or material disposed over or under another may be directly in contact or may have one or more intervening materials. Moreover, one material disposed between two materials or materials may be directly in contact with the two layers or may have one or more intervening layers. In contrast, a first material or material "on" a second material or material is in direct contact with that second material/material. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Described herein are exemplary embodiments of a prober space transformer to interface an E-testing apparatus to an unpackaged die under test. In some embodiments, the space transformer includes a substrate and a perforated plate disposed on the substrate. The substrate includes conductive traces and an array of conductive probe pins extend outwardly from anchor points on the substrate. The pins are electrically coupled to at least one of the conductive traces on the substrate as a prober interface between an E-testing apparatus and a DUT. The perforated plate may be affixed to a surface of the substrate and includes an array of perforations through which the conductive pins may pass. The perforated plate may provide one or more of lateral pin support and support and/or protection to the underlying substrate and conductive traces thereon. The perforated plate may include a metal sheet. A polymeric material may be disposed on at least a sidewall of the perforations to insulate the metal sheet from the conductive probe pins.

Figure 1:
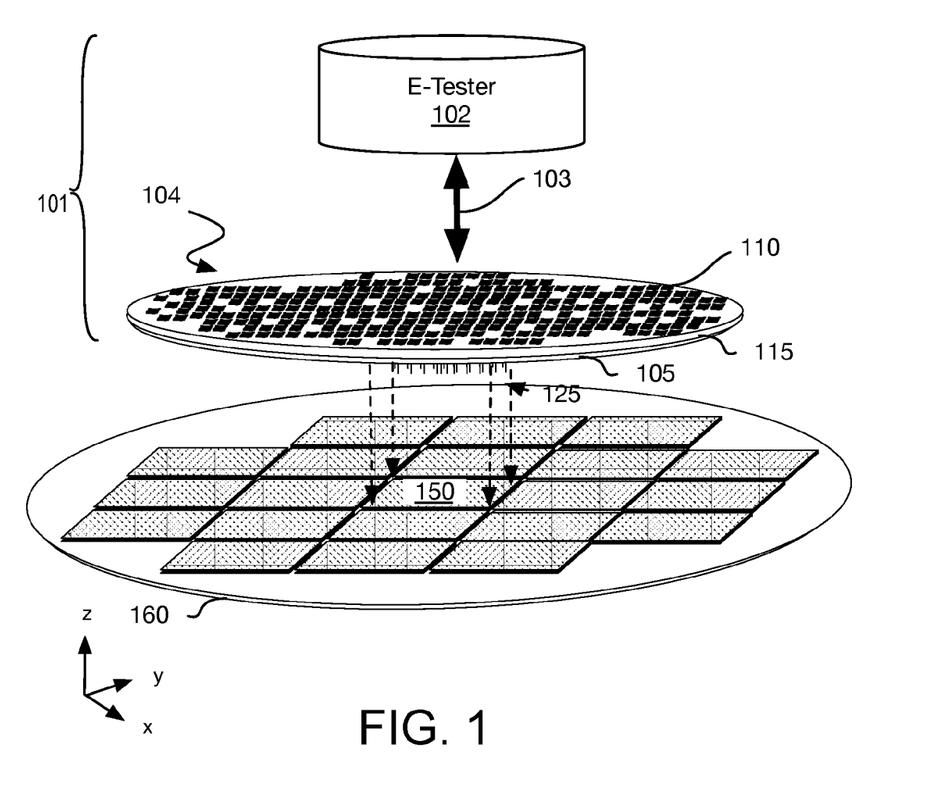
FIG. 1 is an isometric view of an electrical testing apparatus for unpackaged die, in accordance with some embodiments.

FIG. 1 is an isometric view of an electrical testing apparatus 101 for an unpackaged DUT 150, in accordance with some embodiments. Apparatus 101 includes an electrical tester (E-tester) 102 electrically coupled to a space transformer 104. In some embodiments, E-tester 102 is commercially available automated test equipment (ATE) configured for functionality, performance, and/or stress testing of an IC. Electrical coupling 103 between E-tester 102 and space transformer 104 may be any known prober Interface Test Adapter (ITA). Space transformer 104 further provides electronic connections between electrical coupling 103 and unpackaged DUT 150. In the illustrated embodiment, space transformer 104 includes a substrate 115 and electrical coupling 103 makes electrical connections to metallization 110 disposed on a fist side of substrate 115. Substrate 115 further includes conductive trace routing electrically coupling metallization 110 to a probe pin array 125 extending from a second side of substrate 115. Substrate 115 may further include additional circuitry to adapt signals between the E-tester 102 and unpackaged DUT 150. In some exemplary embodiments, substrate 115 is an organic polymer, which may advantageously facilitate fabrication of probe pin array 125. The substrate 115 may therefore have a relatively low Young's modulus, rendering it susceptible to wear during testing operations.

Unpackaged DUT 150 is disposed on a carrier 160. In some embodiments, DUT 150 is a thinned die that has been singulated, for example by a laser scribing operation. Carrier 160 may be a membrane, such as a backside tape applied after a backside grind operation. During an electrical die testing operation, test points on DUT 150 are to be aligned with probe pin array 125 and brought into electrical contact with probe pin array 125, for example by an ATE handler. In some embodiments, conductive features in a top-level of metallization on DUT 150 (e.g., a bump or an under bump metallization) are brought into contact with probe pin array 125 and an electrical test algorithm is executed on the DUT through the array of conductive pins. As such, space transformer 104 may supplant the role of a DUT socket typically employed to bridge the connection between a prober ITA and a packaged DUT. Similar to a socket, space transformer 104 is to be robust enough to withstand the rigors of high volume testing and/or comprise an assembly. In exemplary embodiments where substrate 115 is an organic polymer, space transformer 104 is an assembly including a perforated cover plate or sheet 105 affixed to substrate 115 so as to be disposed between unpackaged DUT 150 and substrate 115. Advantageously, perforated cover plate 105 has a higher modulus than that of substrate 115, improving the wear characteristics of space transformer 104.

Figure 2A:
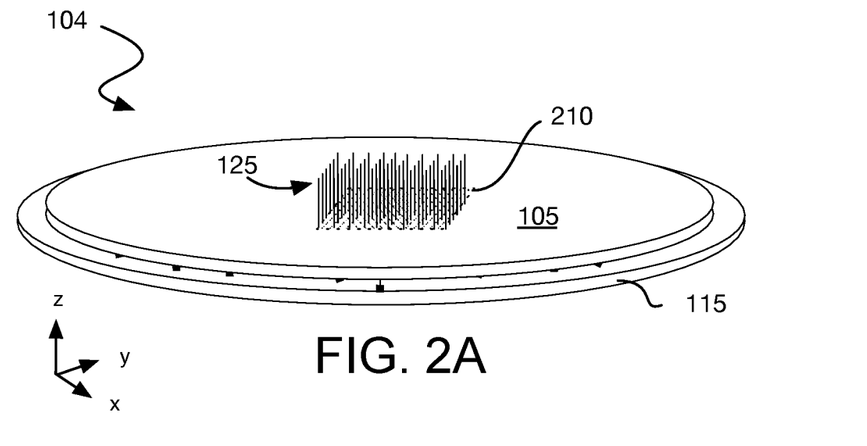
FIGS. 2A, 2B, and 2C are isometric views of a space transformer assembly for electrical die test, in accordance with some embodiments.
Figure 2B:
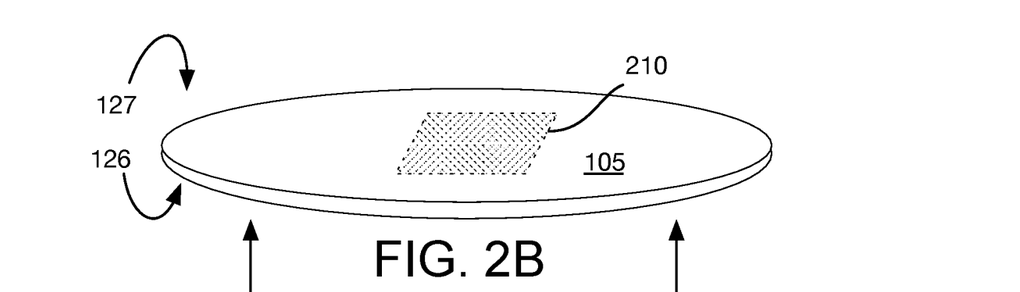
Figure 2C:
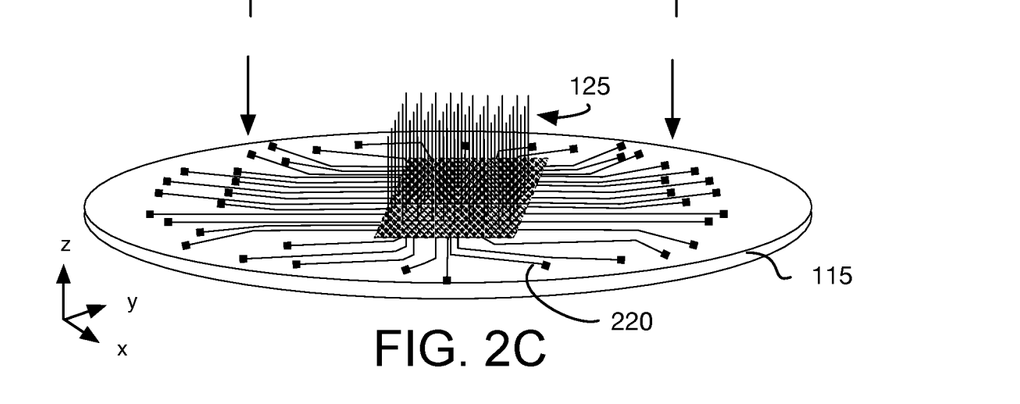

FIGS. 2A, 2B, and 2C are isometric views of space transformer 104 for electrical die test, in accordance with some embodiments. In FIG. 2A, space transformer 104 is inverted from the configuration illustrated in FIG. 1. Perforated plate 105 is affixed as a cover over substrate 115, for example protecting a surface where probe pin array 125 is anchored to substrate 115. As further illustrated in FIG. 2B and FIG. 2C, perforated cover plate 105 is affixed to substrate 115, for example with an adhesive. Perforated plate 105 includes a two-dimensional array of perforations 210 centrally located on the plate to accommodate passage of probe pin array 125. The perforation array 210 is dimensioned to accommodate any number of probe pins as a function of test points available on the DUT. In some microprocessor embodiments, for example, perforation array 210 extends over an area of 1 $cm^2$, or more. In some further embodiments, perforation array 210 extends at least 1 cm in at least one dimension of the array (e.g., x-dimension). Probe pin dimensions may vary, but in some exemplary embodiments a single probe pin has a diameter below 50 μm, and advantageously below 40 μm. Probe pins of such diameter may extend outwardly from substrate 115 by about 300 μm, or more. Substrate 115 further includes a plurality of conductive traces 220 that break out from the dense probe pin array 125, for example with a single trace electrically coupled to an anchored end of one pin of probe pin array 125. After breakout, traces 220 may pass vertically through substrate 115 to metallization 110 (FIG. 1).

In some advantageous embodiments, cover plate 105 is of a material having a significantly higher Young's modulus than that of substrate 115. Cover plate 105 may have a modulus that is at least twice that of substrate 115, advantageously three times that of substrate 115, and more advantageously five times that of substrate 115. In some exemplary embodiments, cover plate 105 has a Young's modulus of at least 100 GPa at 23° C. While many high modulus materials are known, perforated cover plate 105 advantageously also has a CTE (e.g., at least in the x or y dimension) well-matched to that of substrate 115. A better CTE match between substrate 115 and perforated cover plate 105 reduces thermo-mechanical stresses experienced by space transformer 104. In some embodiments where a DUT is thermally stressed during a testing operation, space transformer 104 may also experience thermal cycles between room temperature (e.g., 23° C.) and an elevated testing temperature, which is typically limited only by the DUT metallization reflow temperature (e.g., 250° C., or more).

Figure 3A:
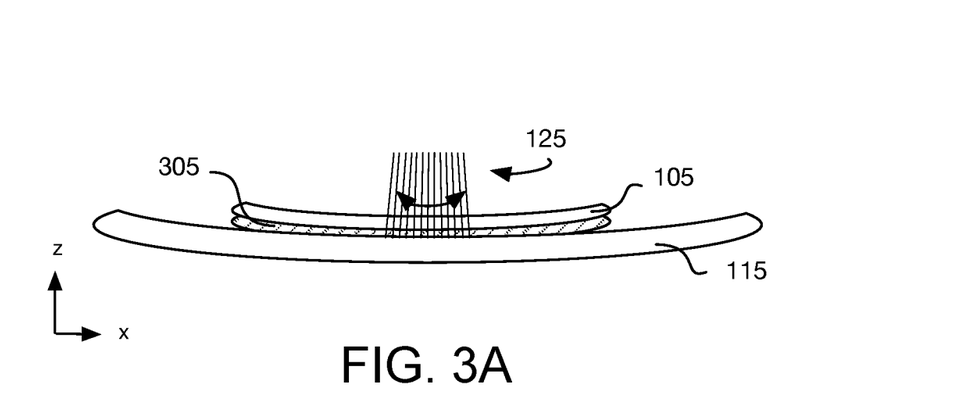
FIGS. 3A and 3B are cross-sectional views illustrating an effect of CTE mismatch between components of a space transformer compared to well-matched components, in accordance with some embodiments.
Figure 3B:
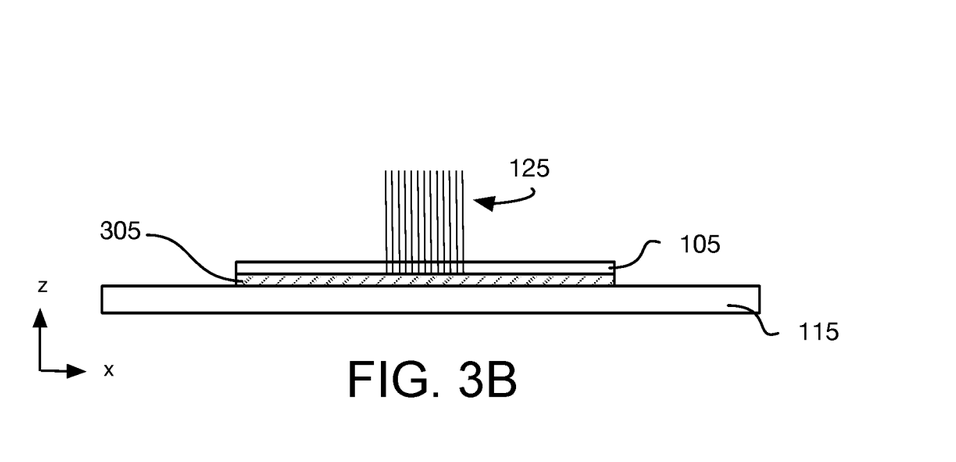

FIGS. 3A and 3B are cross-sectional views of cover plate 105 affixed to substrate 115 with an adhesive layer 305. FIG. 3A illustrates space transformer warpage at an elevated testing temperature resulting from CTE mismatch between an organic polymer space transformer substrate (e.g., having a CTE of about 20 ppm/° C.) and a ceramic perforated cover plate (CTE of about 3 ppm/° C.). As shown in FIG. 3A, warpage in space transformer 104 may further induce mis-alignment in probe pines 123 that hinder contact with a DUT. In the illustrated example where thermal expansion experienced by substrate 115 exceeds that of perforated cover plate 105, the effective pitch of probe pin array 125 is reduced by curvature in space transformer 104. A short between probe pins may occur if the CTE mismatch is severe and mis-probing can occur with less extreme warpage. Components of the space transformer assembly illustrated in FIG. 3B have a matched CTE. While the ideal CTE of the perforated plate depends on the composition of substrate 115, in some advantageous embodiments where substrate 115 comprises an organic polymeric material, the CTE of perforated plate 105 is at least 15 ppm/° C., and advantageously 20 ppm/° C., or more.

In some advantageous embodiments, a space transformer includes a metallic perforated cover plate. Some metals are known to possess both a relatively high CTE and a high modulus. Some exemplary metals having a CTE in the range of 15-20 ppm/° C. include copper (Cu) and many alloys thereof, aluminum (Al) and many alloys thereof, and many stainless steel (SS) alloys. Metals may be alloyed and/or composited to tune CTE. Metals can be readily processed with industry standard methods such as, but not limited to, stamping, rolling, forging, and micro machining to arrive at sheets with a uniform thickness advantageously 300 µm, or less (e.g., 200-300 µm). With metal be electrically conductive however, the perforated cover plate is advantageously a composite of the metal sheet and an insulative material disposed on at least a sidewall of perforations in the metal sheet to electrically insulate the probe pins from the metal sheet. The insulative material itself need not have a high modulus and/or CTE well-matched to the space transformer substrate.

For a metallic composite cover plate, the minimum diameter of perforations through the metal sheet may be predetermined based, at least in part, on the desired thickness of the insulative material layer. For embodiments where the probe pin diameter is below 50 µm and the array has a pitch of about 100 µm (e.g., 90-110 µm), through holes in the metal sheet may have a minimum diameter no more than, and advantageously less than, 80 µm to allow for an insulative material layer thickness of 2-20 µm as measured normal to the perforation sidewall. The minimum diameter of perforations through the metal sheet may also be dependent upon whether the insulative layer is a purely additive material layer (e.g., deposited onto the metal sheet surface), or at least partially consumptive (e.g., oxidizing or otherwise converting a portion of the metal sheet surface). For the former, the drilling diameter may be larger (e.g., 70-80 µm to accommodate a 50 µm final through hole diameter and a 10-15 µm insulative material layer thickness). For the latter, the metal sheet drilling diameter may be smaller (e.g., 60-70 µm to accommodate a 50 µm final through hole diameter and a 10-15 µm insulative material layer thickness).

In some embodiments, a non-native anodization layer is disposed on the perforation sidewall. For example, an amorphous $Al_2O_3$ may be formed on sidewall surfaces of perforations in an Al cover plate. Such anodization typically has a lower CTE than that of the base metal, so there is a risk that large areas of anodization will delaminate and/or flake from the surface of the metal sheet during e-test thermal cycles. In some embodiments therefore, anodization is limited to sidewalls of the perforation and absent from at least a portion of bottom and top cover plate surfaces (e.g., 126 and 127 in FIG. 2B). In some embodiments, prior to assembly of the space transformer, top and bottom cover plate surfaces are polished to remove any non-native anodization while retaining the non-native anodization on the perforation sidewalls. In some advantageous embodiments, top and bottom cover plate surfaces may be selectively stripped of anodization to retain non-native anodization on the top and bottom cover plate surfaces only within an area inside the outer perimeter of the perforation array. For example, where perforation array 210 (FIG. 2B) has an area of 1 $cm^2$, anodization within this 1 $cm^2$ region may be retained on both the perforation sidewalls and on top and/or bottom surfaces of cover plate 105. Within the finely pitched perforation array 210 (e.g., 50 µm spaces between nearest neighboring perforations), strain applied to the anodization film may not exceed the adhesion strength of the anodization layer and retention of non-native anodization on the metal sheet surface proximate to the DUT may provide some advantageous electrical insulation.

In some embodiments, a polymeric material is disposed on sidewalls of a perforation in a metallic cover plate. The polymeric material may be any known to have a dielectric breakdown strength and/or electrical leakage characteristic at a 2-20 µm thickness sufficient for the e-test algorithm. For example, any polymeric resin employed as dielectric in the microelectronics industry may be suitable. The polymeric material is also advantageously compatible with laser ablation. In some exemplary embodiments, the polymeric material comprises at least one of: epoxy acrylate; epoxy Novolac® acrylate; methacrylate; polyimide; bismaleimide; polyurethane; polycarbonate; polyester; phenol; or benzocyclobutene or parylene (via chemical vapor deposition). In further embodiments, the polymeric material disposed on the perforation sidewall also includes a filler, such as, but not limited to, silica particles, ceramic particles, glass fibers, or aramid fibers. While the amount of filler may vary, in some embodiments filler is around 90 wt %.

Figure 4:
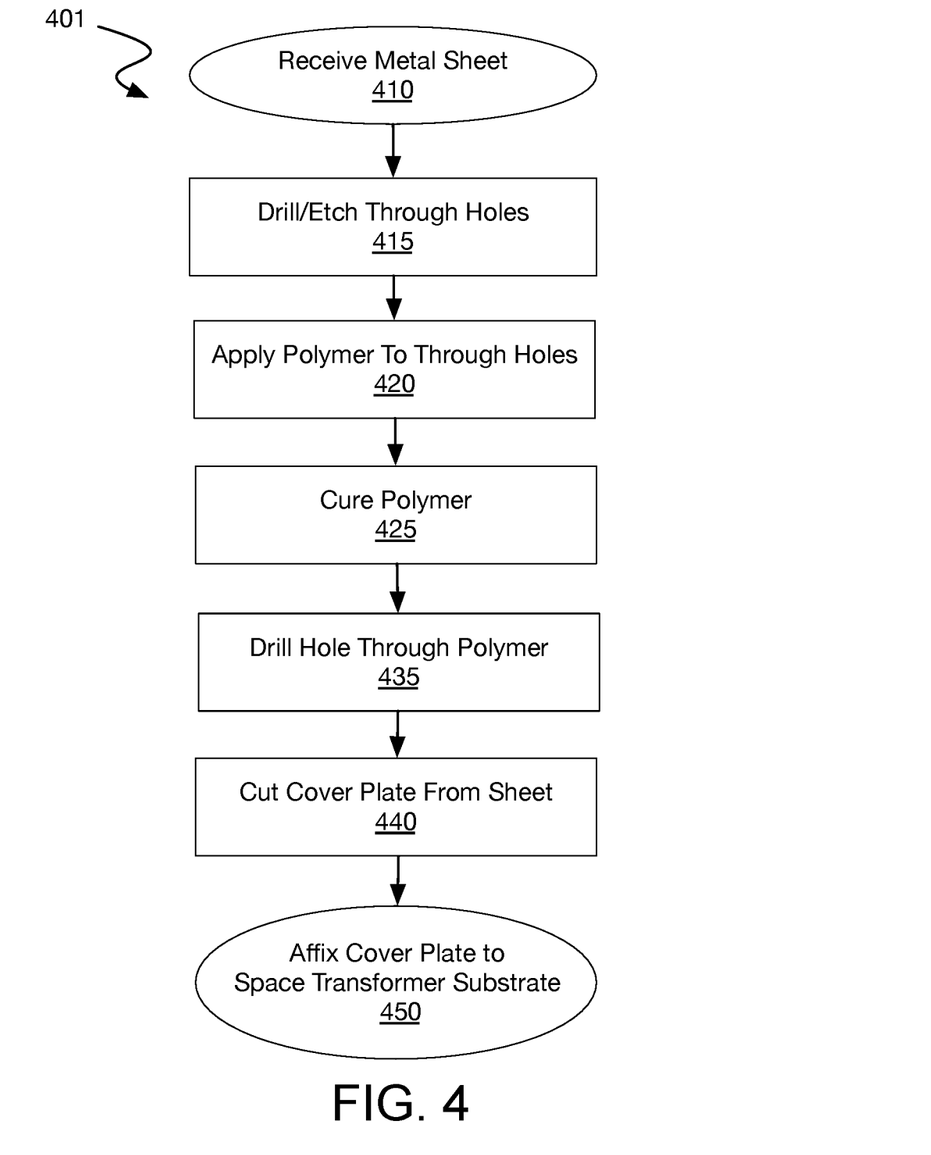
FIG. 4 is a flow diagram illustrating a method of fabricating a space transformer cover plate, in accordance with some embodiments.

FIG. 4 is a flow diagram illustrating a method 401 for fabricating a space transformer cover plate, in accordance with some embodiments. FIG. 5A-5E illustrate cross-sectional views of a through hole in a space transformer cover plate as selected operations of the method in FIG. 4 are performed, in accordance with some embodiments.

Figure 5A:
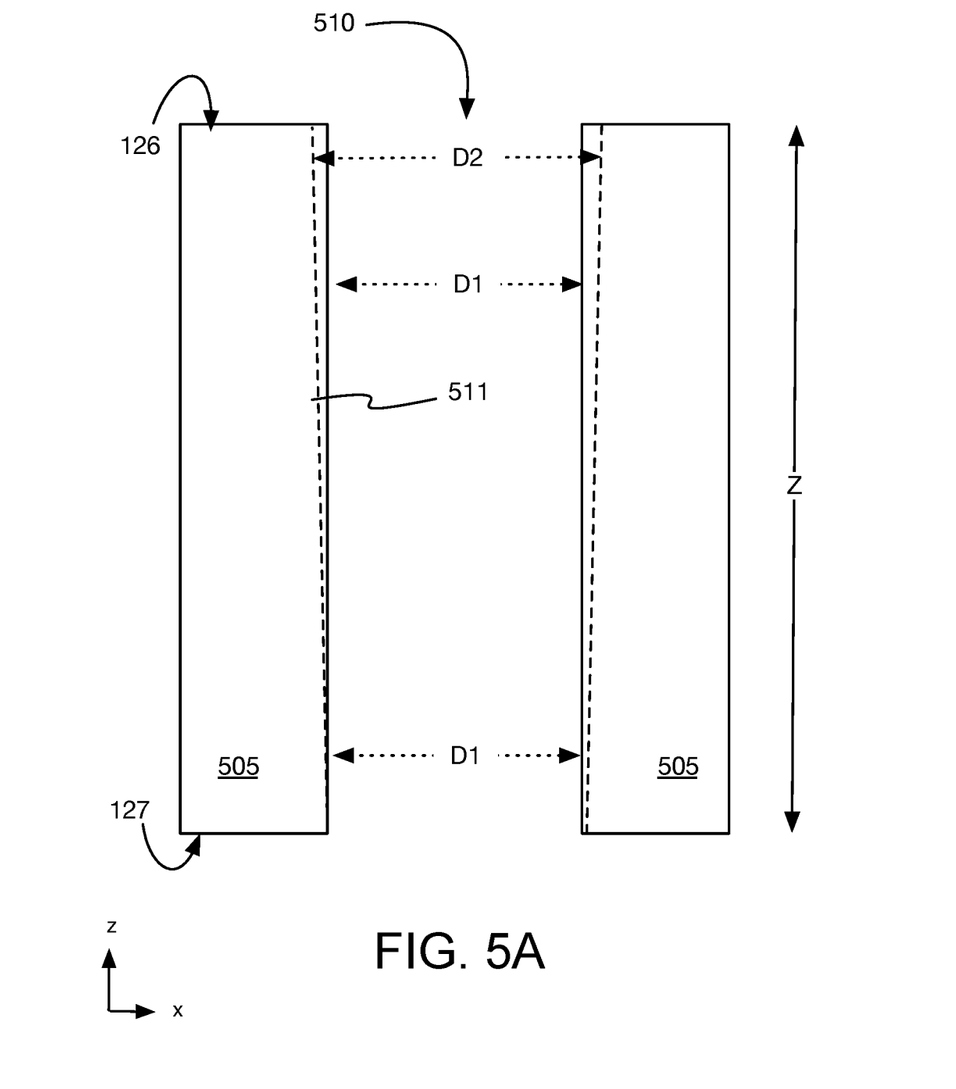
FIGS. 5A, 5B, 5C, 5D and 5E illustrate cross-sectional views of a through hole in a space transformer cover plate as selected operations of the method in FIG. 4 are performed, in accordance with some embodiments.

Referring first to FIG. 4, at operation 410 a metal sheet (e.g., SS, Al, Cu) of the desired thickness (e.g., 250-300 µm) is received. At operation 415 through hole perforations are drilled or etched into the metal sheet at the desired pitch to form a 2D perforation array (e.g., 80 µm, or less, at a pitch of 110-130 µm, or less). In some embodiments, operation 415 entails a mechanical drilling process. However, for embodiments where the through hole diameter is significantly less than 80 µm, any known laser drilling (ablation) process may be employed. Alternatively, a masked chemical etch may be performed according to any technique known for the metal sheet. FIG. 5A illustrates one through hole 510 having a substantially constant diameter $D_1$ of 80 µm, or less, extending through a metal sheet 505 having a thickness Z of 300 µm, or less. Through hole 510 has a profile indicative of a mechanical drilling process. Dashed line 511 illustrates an exemplary laser drilled profile that may have slightly more sloped or tapered sidewalls (e.g., 70-85° sidewall angle) with a bottom diameter of 80 µm, or less, and a larger top diameter $D_2$.

Figure 5B:
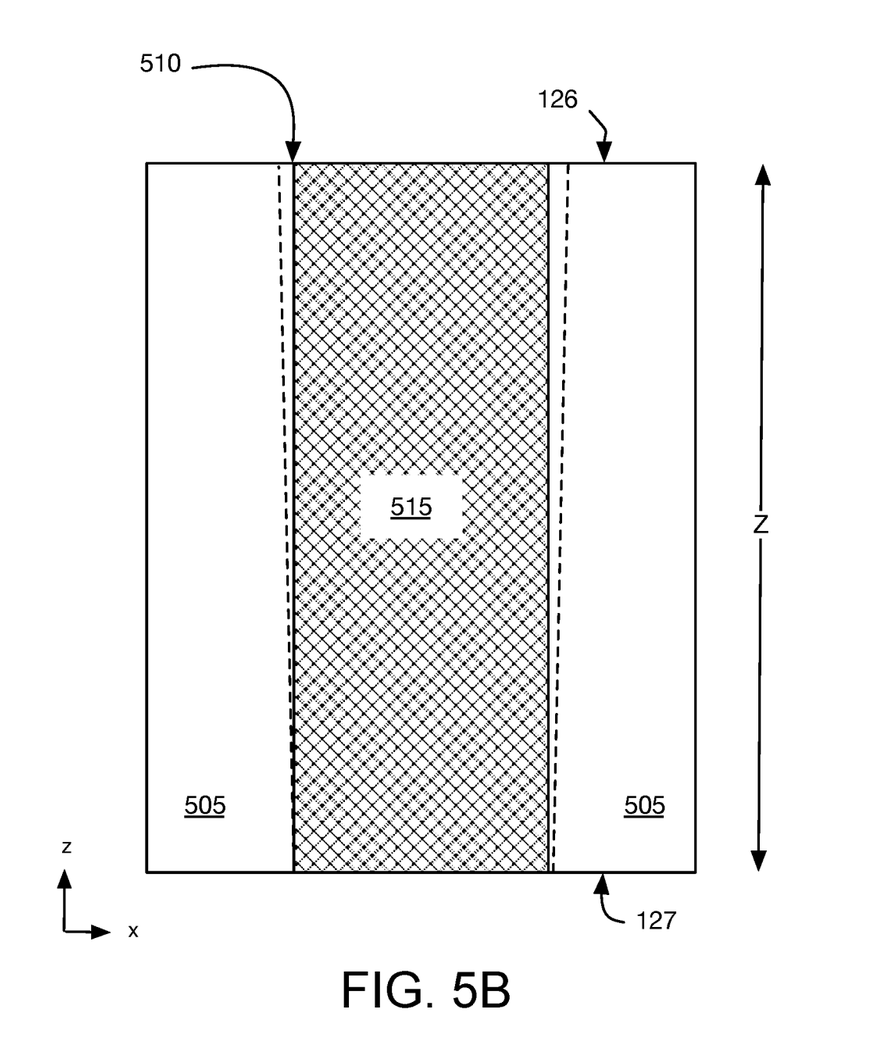

Returning to FIG. 4, method 401 continues at operation 420 where a resin is applied onto the through holes drilled at operation 420. Various techniques may be employed at operation 420, such as, but not limited to, spin-casting, spraying, chemical vapor deposition and stencil printing. In some embodiments, a 4-30 µm coating of the resin material is deposited on sidewalls of the metal sheet through hole. Chemical vapor deposition of polymeric resins such as parylene may offer conformal coatings of polymers onto the metal plate surfaces including inner walls of the perforations. In other embodiments, the perforations are completely backfilled with the polymer resin. The polymer resin is then cured with a co-reactant at operation 425 following any known technique for the given material (e.g., thermal bake, UV exposure, etc.). The backfilling process, whether based on stencil printing or spin-casting, may result in a polymer film on the top and/or bottom surfaces of the metal sheet. Such overburden may be left on the metal sheet for electrical isolation. In some alternative embodiments, the polymer film on at least the top surface of the metal sheet (i.e., the surface that is to be exposed to a DUT during probing) is removed at operation 425 to ensure the exposed surface is of a high modulus material. Any known process, such as mechanical polishing, may be employed to remove polymer selectively from surface of the metal sheet while retaining polymer on the perforation sidewalls. In some embodiments where the polymer film is removed from the top metal sheet surface, it is retained on the bottom metal sheet surface as electrical isolation that will be disposed between the metal sheet and space transformer substrate. Alternatively, the polymer film may be selectively removed from both top and bottom surfaces of the metal sheet. FIG. 5B illustrates an exemplary embodiment of metal sheet 505 following operation 425. Through hole 510 is backfilled with cured polymer 515 while metal sheet surfaces 126, 127 are bare (e.g., not coated with a layer of polymer 515).

Returning to FIG. 4, method 401 continues at operation 435 where a second through hole is formed within the polymer backfill to open a passage through the backfill that can accommodate a probe pin. Operation 435 may be skipped for embodiments where the perforation sidewalls have been coated with a 2-20 µm polymeric material layer that maintained a through hole of sufficient inner diameter (e.g., 50 µm). At operation 435 through hole perforations are drilled or etched into the polymer backfill at the desired pitch to form a 2D perforation array (e.g., 50 µm, or less, at a pitch of 110-130 µm, or less) matching the probe pin array. In some embodiments, operation 435 entails a laser drilling (ablation) process. Alternatively, where a photosensitive polymer was employed, a masked exposure and develop process may be employed. Ideally, the longitudinal axis of the through hole formed in the polymer backfill is aligned with the longitudinal axis of the through hole in the metal sheet. However, concentricity of the through holes need not be exact as long as a sufficient thickness of polymeric material is retained on the metal perforation sidewalls. Concentricity of the through holes is indicative of a polymer coating process while some level of misalignment of the longitudinal axes is one indication of patterning/drilling the polymer backfill.

Figure 5C:
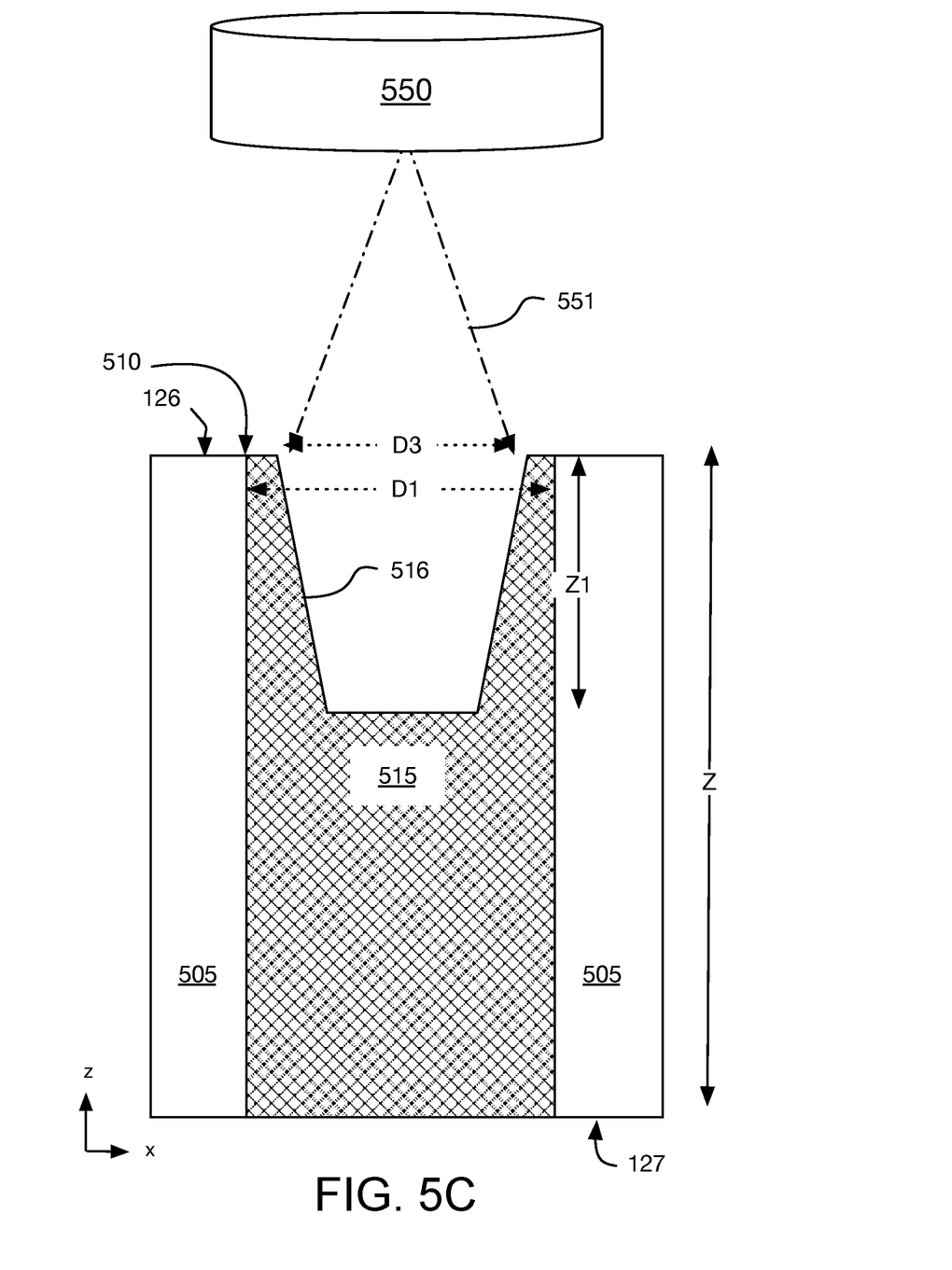
Figure 5D:
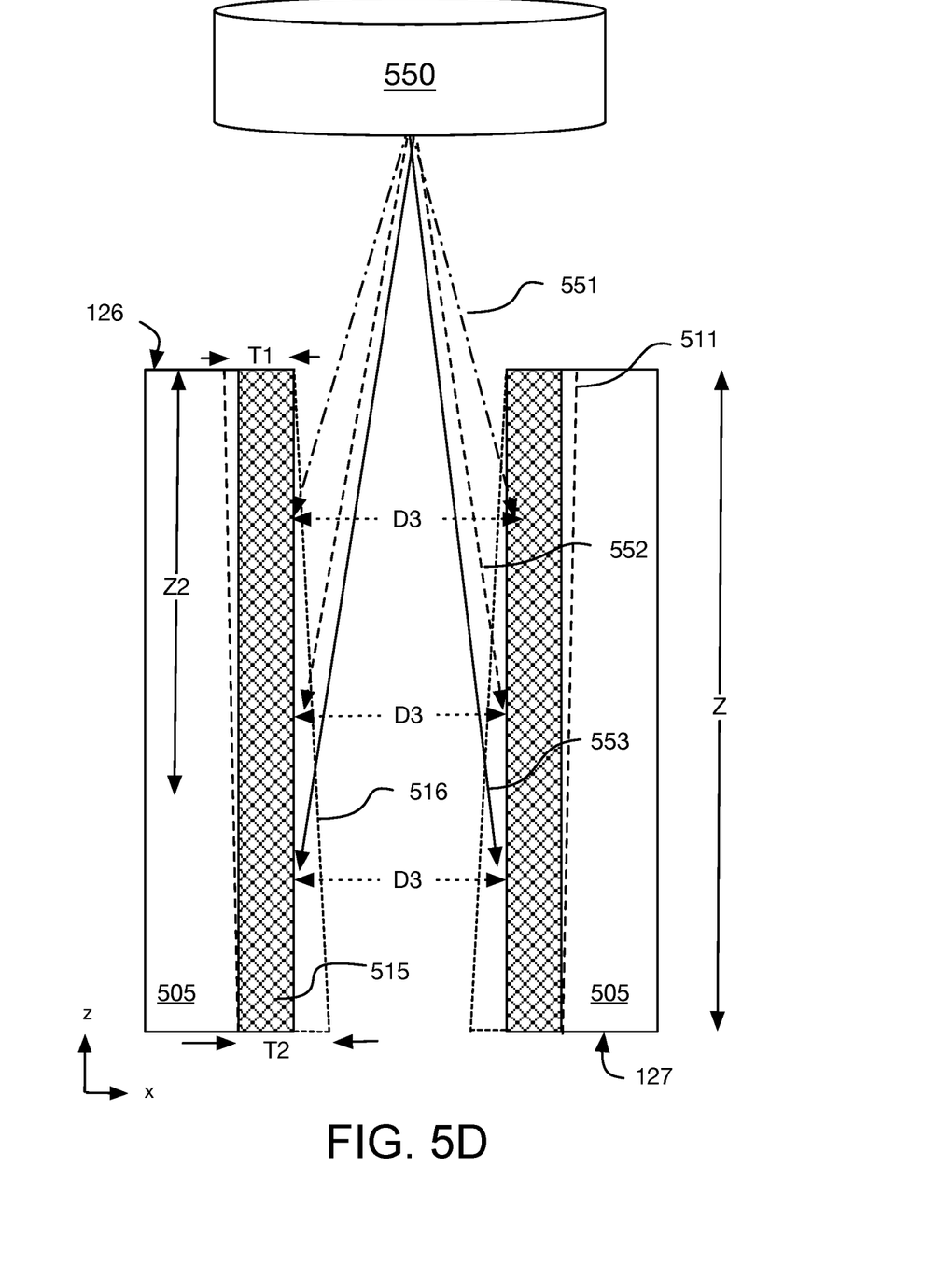

FIG. 5C, 5D illustrates an exemplary embodiment where polymer backfill is laser ablated. Laser ablation rates may be advantageously increased for polymers with a higher cross link density (e.g., generated from a resin with a greater amount of curing agent). The addition of filler may also impact the via depth profiles due to dissimilar ablation rates, so the composition of the polymeric material may be dependent on the techniques employed to re-open the perforations. The polymer backfill may be more susceptible to developing significant sidewall taper/slope during laser ablation than is the metal sheet as a function of poorer heat dissipation. In some embodiments, angle of incidence of a beam spot having a significantly smaller spot diameter than that of the through hole is dynamically adjusted during ablation to direct beam energy toward the sidewall as ablation progresses. As shown in FIG. 5C, laser galvanometer 550 is controlled to emit a beam spot along a first beam path 510 associated with a fist angle of incidence to a top surface of polymer backfill 515. A beam spot of 5 µm for example may follow a first beam path 551 with a minimum diameter $D_3$ (e.g., less than 60 µm). The first beam path 551 may result in ablation of polymer 515 to a first depth $Z_1$. Angle of sidewall 516 may be less than that of sidewall 510 (e.g., 70-80°). As shown in FIG. 5D, laser galvanometer 550 is controlled to emit a beam spot along a second beam path 552 associated with a second (e.g., steeper) angle of incidence that intersects a bottom portion of sidewall 516 formed with the first beam path. The angle of sidewall 516 may then be increased toward that of sidewall 510 (e.g., 80-90°) while ablating a to a second depth $Z_2$. This process may be iterated (e.g., with additional beam paths 553) as needed to clear a through hole in polymer backfill 515 of minimum diameter $D_3$. The thickness of polymeric material on the metal sidewall may be substantially independent of z-height within the through hole where sidewall angles are near 90°. For other embodiments with significant polymer sidewall taper, the sidewall thickness of polymer 515 may vary between two ends of the through hole (e.g., $T_1$ proximal to surface 126 and $T_2$ proximal to surface 127) as a function of differences in slope of perforation sidewalls 511 and 516.

Returning to FIG. 4, at operation 440 the perforated sheet may be cut and/or shaped as needed to accommodate the space transformer substrate. The composite cover plate including a plurality of dielectric polymer-lined perforations in a metallic sheet is then affixed to the space transformer substrate at operation 450 to complete method 401. Operation 450 may entail gluing the perforated composite cover plate to the space transformer substrate with any adhesive material known to be suitable for the expected temperature range (e.g., 250° C.).

Figure 5E:
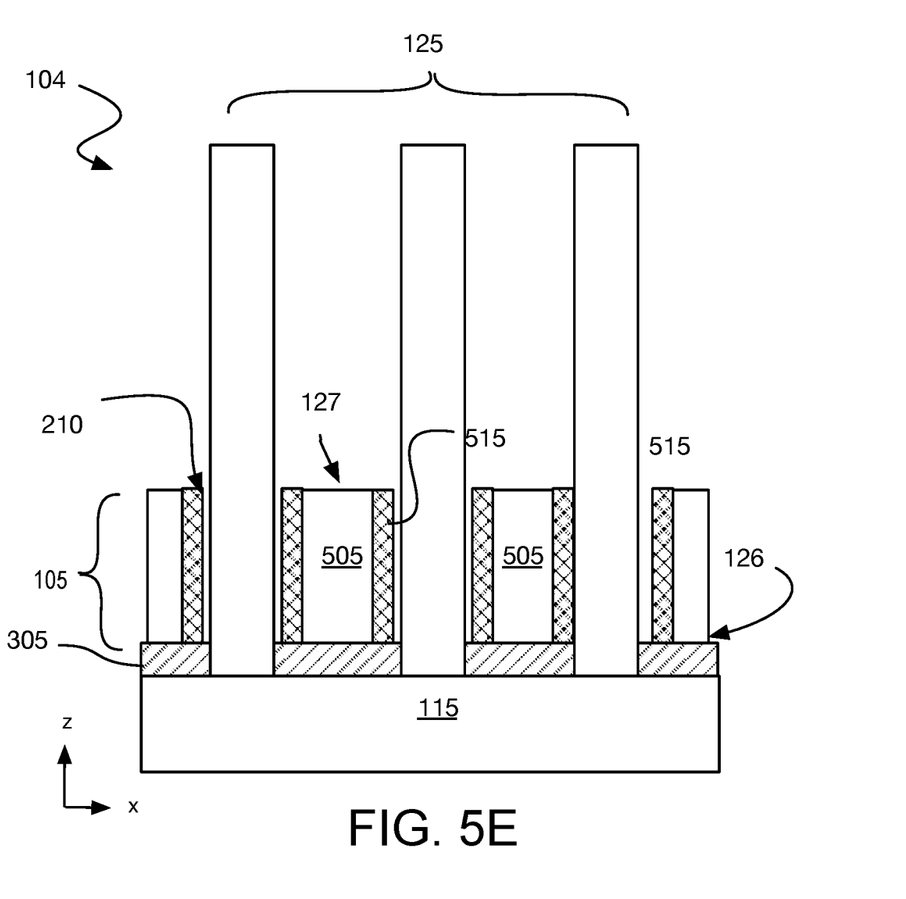

FIG. 5E illustrates a sectional view of space transformer 104 including a cover plate 105 having a plurality of polymer lined perforations in a metallic sheet, in accordance with some embodiments. Space transformer 104 may be an output of method 401, for example. Perforation 210 has a minimum inner diameter defined by a maximum sidewall thickness of polymeric material 515 and a minimum outer diameter of the through hole in metal 505. As further illustrated in FIG. 5E, a cover plate top surface 127, opposite substrate 115, may be substantially free of polymeric material 515. A bottom cover plate surface 126 may also be substantially free of polymeric material 515. In some embodiments where perforations have significant sidewall taper (e.g., 80°, or less), the cover plate surface at an end of the through hole having a larger diameter is affixed to the substrate. For example, for embodiments with sloped sidewall profiles 511 and/or 516 (FIG. 5D), bottom cover plate surface 126 is glued to substrate 115 to ensure the working surface of the space transformer interfacing with the DUT provides an electrically insulated bushing of minimum diameter about the circumference of probe pins 125. Adhesive 305 may also be electrically isolative so that during prober operation, metal 505 may be electrically floating or coupled to a reference voltage potential to be supplied by the electrical testing apparatus (e.g., prober ground).

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the invention is not limited to the embodiments so described, but can be practiced with modification and alteration without departing from the scope of the appended claims. For example the above embodiments may include specific combinations of features as further provided below.

In one or more first embodiments, an electrical-test prober space transformer, comprises a substrate including a plurality of conductive traces, each of the traces to electrically couple with an electrical testing apparatus, an array of conductive pins, each of the pins extending outwardly from a first pin end anchored to the substrate and electrically coupled to at least one of the conductive traces, and a perforated plate affixed to a surface of the substrate and including an array of perforations through which the conductive pins pass, wherein the perforated plate comprises a metal sheet insulated from the conductive pins by an insulative material disposed on a sidewall of the perforations, but absent from at least a portion of a top surface of the metal sheet opposite the substrate.

In furtherance of the first embodiments, the insulative material is a polymeric material.

In furtherance of the first embodiments, the substrate comprises an organic polymer, and the perforated plate has a lateral coefficient of thermal expansion (CTE) of at least 15 ppm/° C. and a Young's modulus of at least 100 GPa at 23° C.

In furtherance of the first embodiments, the metal sheet comprises at least one of copper or an alloy thereof, aluminum or an alloy thereof, or a stainless steel alloy.

In furtherance of the first embodiments, a perforation in the array of perforations has a minimum diameter less than 80 μm and a pitch less than 150 μm.

In furtherance of the first embodiments immediately above, the insulative material is a polymeric material defining a through hole within each of a plurality of the perforations, the through hole having a minimum diameter less than 60 μm.

In furtherance of the first embodiments immediately above, a longitudinal axis of the through hole is not coincident with a longitudinal axis of the perforation.

In furtherance of the first embodiments immediately above, the through hole has a sidewall slope that is less than that of the perforation through the metal sheet.

In furtherance of the first embodiments, the insulative material is a polymeric material and the polymeric material is absent from a back side the perforated plate, facing the substrate.

In furtherance of the first embodiments, the insulative material is a polymeric material and the polymeric material is a derivative of a resin selected from the group consisting of: epoxy acrylate, epoxy Novolac® acrylate, methacrylate, polyimide, bismaleimide, polyurethane, polycarbonate, polyester, phenol, and benzocyclobutene, and parylene.

In furtherance of the first embodiments, the insulative material is a polymeric material and the polymeric material is a matrix component of a composite material further including a filler.

In furtherance of the first embodiments immediately above, the filler is selected from the group consisting of: silica particles, ceramic particles, glass fibers, and aramid fibers.

In furtherance of the first embodiments immediately above, the metal sheet is electrically floating or coupled to a reference voltage potential to be supplied by the electrical testing apparatus.

In one or more second embodiments, a method for fabricating an electrical-test prober space transformer comprises receiving a substrate including a plurality of conductive traces and an array of conductive pins, each of the pins extending outwardly from a first pin end anchored to the substrate and electrically coupled to at least one of the conductive traces. The method comprises receiving a metal sheet. The method comprises forming an array of perforations through the metal sheet. The method comprises applying a polymeric material on at least a sidewall of the perforations. The method comprises affixing the metal sheet to a surface of the substrate with the array of conductive pins passing through the array of perforations and electrically insulated by the polymeric material.

In furtherance of the second embodiments, forming the array of perforations through the metal sheet further comprises mechanical drilling, and applying a polymeric material on at least a sidewall of the perforations further comprises backfilling the perforations, curing the polymeric material, and laser ablating a through hole in the cured polymeric material.

In furtherance of the second embodiments immediately above, the mechanical drilling comprises forming a first through hole having a minimum diameter less than 80 μm, and the laser ablating comprises forming a second through hole having a minimum diameter less than 60 μm, and a sidewall angle that is less than that of the first through hole.

In furtherance of the second embodiments, laser ablating the polymeric material further comprises ablating a first thickness of the polymeric material by directing a laser light beam at a first angle of incidence along a first circular path defining the perforation perimeter, and ablating a second thickness of the polymeric material by directing a laser light beam at a second angle of incidence along a second circular path intersecting a sidewall of the first thickness.

In furtherance of the second embodiments, backfilling the perforations further comprises stencil printing.

In one or more third embodiments, a method of testing a singulated unpackaged die comprises aligning the die to an array of conductive pins disposed on a prober space transformer, the pins extending outwardly from first pin ends electrically coupled to conductive traces disposed on a space transformer substrate, and passing through a perforated metal sheet affixed to a surface of the substrate by an adhesive, the pins insulated from the metal sheet by a polymeric material disposed on at least a sidewall of the perforations, contacting a top metallization level of the die with second pin ends of the conductive pin array, and executing an electrical test algorithm on the die through the array of conductive pins.

In furtherance of the third embodiments, the perforated metal sheet has a lateral coefficient of thermal expansion (CTE) of at least 15 ppm/° C. and a Young's modulus of at least 100 GPa at 23° C.

However, the above embodiments are not limited in this regard and, in various implementations, the above embodiments may include the undertaking of only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. An electrical-test prober space transformer, comprising:
 a substrate including a plurality of conductive traces, the traces to electrically couple with an electrical testing apparatus;
 an array of conductive pins, the pins extending outwardly from a-first pin ends anchored to the substrate and electrically coupled to the conductive traces; and
 a perforated plate affixed to a surface of the substrate and including an array of perforations through which the conductive pins pass, wherein the perforated plate comprises a metal sheet insulated from the conductive pins by an insulative material on a sidewall of the perforations, but absent from at least a portion of a top surface of the metal sheet opposite the substrate.

2. The prober space transformer of claim 1, wherein the insulative material is a polymeric material.

3. The prober space transformer of claim 2, wherein the polymeric material defines a through hole within each of a plurality of the perforations, the through hole having a diameter gradation, with a largest diameter of the through hole proximal to the substrate.

4. The prober space transformer of claim 2, wherein the polymeric material is a derivative of a resin selected from the group consisting of: epoxy acrylate, epoxy Novolac® acrylate, methacrylate, polyimide, bismaleimide, polyurethane, polycarbonate, polyester, phenol, and benzocyclobutene, and parylene.

5. The prober space transformer of claim 2, wherein the polymeric material is a matrix component of a composite material further including a filler.

6. The prober space transformer of claim 5, wherein the filler is selected from the group consisting of: silica particles, ceramic particles, glass fibers, and aramid fibers.

7. The prober space transformer of claim 1, wherein:
 the substrate comprises an organic polymer; and
 the perforated plate has a lateral coefficient of thermal expansion (CTE) of at least 15 ppm/° C. and a Young's modulus of at least 100 GPa at 23° C.

8. The prober space transformer of claim 1, wherein the metal sheet comprises at least one of copper or an alloy thereof, aluminum or an alloy thereof, or a stainless steel alloy.

9. The prober space transformer of claim 1, wherein a perforation in the array of perforations has a minimum diameter less than 80 μm and a pitch less than 150 μm.

10. The prober space transformer of claim 9, wherein the insulative material is a polymeric material defining a through hole within each of a plurality of the perforations, the through hole having a minimum diameter less than 60 μm.

11. The prober space transformer of claim 10, wherein a longitudinal axis of the through hole is not coincident with a longitudinal axis of the perforation.

12. The prober space transformer of claim 11, wherein the through hole has a sidewall slope that is less than that of the perforation through the metal sheet.

13. The prober space transformer of claim 1, wherein the metal sheet is electrically floating or coupled to a reference voltage potential to be supplied by the electrical testing apparatus.

14. A method of testing a singulated unpackaged die, the method comprising:
 aligning the die to an array of conductive pins disposed on a prober space transformer, the pins:
  extending outwardly from first pin ends electrically coupled to conductive traces disposed on a space transformer substrate; and
  passing through a perforated metal sheet affixed to a surface of the substrate by an adhesive, the pins insulated from the metal sheet by a polymeric material disposed on at least a sidewall of the perforations, the polymeric material defining a through hole having a diameter gradation, and a largest diameter of the through hole proximal to the substrate;
 contacting a top metallization level of the die with second pin ends of the conductive pin array; and
 executing an electrical test algorithm on the die through the array of conductive pins.

15. The method of claim 14, wherein the perforated metal sheet has a lateral coefficient of thermal expansion (CTE) of at least 15 ppm/° C. and a Young's modulus of at least 100 GPa at 23° C.

* * * * *